United States Patent [19]

Trutna, Jr.

[11] Patent Number: 4,631,416
[45] Date of Patent: Dec. 23, 1986

[54] WAFER/MASK ALIGNMENT SYSTEM USING DIFFRACTION GRATINGS

[75] Inventor: William R. Trutna, Jr., Atherton, Calif.

[73] Assignee: Hewlett-Packard Company, Palo Alto, Calif.

[21] Appl. No.: 564,854

[22] Filed: Dec. 19, 1983

[51] Int. Cl.⁴ .......................... G01B 9/02; G01B 11/27
[52] U.S. Cl. ................. 250/548; 250/237 G; 356/356; 356/400
[58] Field of Search ........... 250/548, 557, 561, 237 G, 250/550; 356/356, 361, 400, 401

[56] References Cited

U.S. PATENT DOCUMENTS

| | | | |
|---|---|---|---|
| 4,200,395 | 4/1980 | Smith et al. | 356/356 |
| 4,211,489 | 7/1980 | Kleinknecht et al. | 356/356 |
| 4,265,542 | 5/1981 | Snow | 356/356 |
| 4,332,473 | 6/1982 | Ono | 250/237 G |
| 4,340,305 | 7/1982 | Smith et al. | 356/356 |

*Primary Examiner*—Edward P. Westin
*Attorney, Agent, or Firm*—John A. Frazzini

[57] ABSTRACT

An alignment method in which light is diffracted from a mask grating to a wafer grating and back through the mask grating to produce a set of output diffraction orders. The intensity of the zeroth output order is monitored and the mask is translated and rotated within the plane containing the mask to align the mask with the wafer. Alignment occurs when the intensity of the zeroth output order is at an extremum. The distance between the mask and wafer is also adjusted to extremize the intensity of the zeroth output order to make the wafer lie within the focal plane of the exposure optics. The wafer mask is preferably a holographic phase grating to simplify production of the grating and to eliminate resist related interference. Two dimensional gratings can be used to achieve alignment with only one grating on each wafer.

13 Claims, 16 Drawing Figures

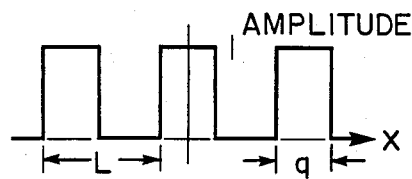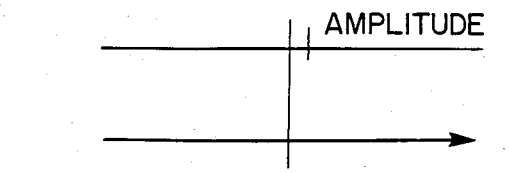
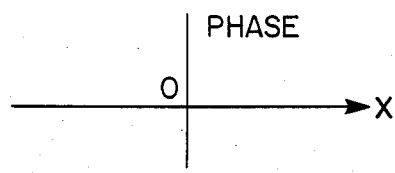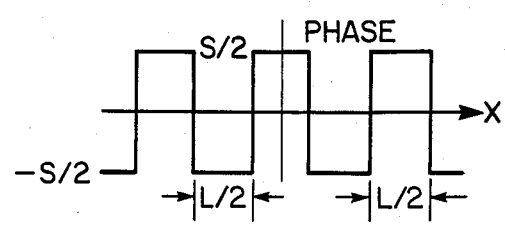
Figure 4A
Figure 4B
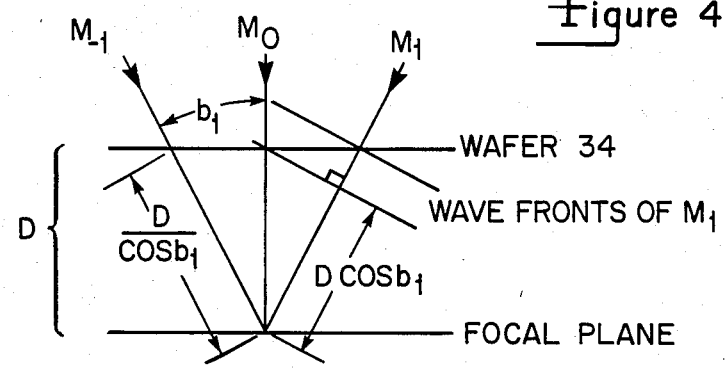
Figure 5
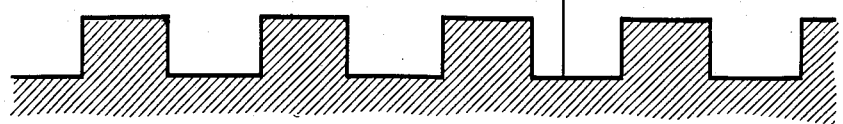
Figure 6

WAFER/MASK ALIGNMENT SYSTEM USING DIFFRACTION GRATINGS

BACKGROUND OF THE INVENTION

The disclosed invention relates in general to wafer/mask alignment systems and more particularly to alignment systems utilizing diffraction gratings. Integrated circuits are manufactured by forming on a wafer a set of layers which are patterned to form circuit components and their interconnections. In circuits formed by photolithographic methods, a layer which is to be patterned is first coated with a light sensitive photoresist. The photoresist is exposed by optically imaging a desired circuit pattern on the photoresist layer. The exposed resist is developed to remove either the exposed or unexposed resist depending on the resist type. The pattern is then transferred to the underlying layer by some etching or deposition process such as plasma etching or chemical etching.

An essential requirement in the photolithography process is the accurate alignment or overlay of each successive masking layer to the previous patterned layer. Even in other types of processing, such as direct-write E-beam lithography, it is important to accurately align the wafer with the E-beam device for each step of writing on the wafer. At present, alignment accuracy rather than optical resolution limits the density of alignment system must produce quick, repeatable, high-precision alignment. To improve throughput and yield, it is advantageous In one type of exposure system known as a step-and-repeat exposure system (stepper), resolution and alignment accuracy are increased by exposing only a small area of the wafer containing one or more integrated circuit images at a time. In general, reduction of exposure field increases resolution. After each exposure, the wafer is moved on an x-y translation stage to the correct location for the next exposure. A typical exposure field size is less than 1 centimeter square, so that typically more than 100 steps are required to expose a 10 cm diameter wafer. In global alignment steppers, each wafer is aligned only once to each mask by using a pair of alignment marks on the wafer to align the x and y positions of the wafer and to rotate the wafer about the z-axis for proper rotational alignment. In field-by-field alignment steppers, alignment is made at each exposure field. Refocussing can also be performed at each exposure field to compensate for wafer distortion introduced for example by processing between masking steps.

An important consideration in the design of an alignment system is the influence of the photoresist process on alignment mark visibility. At present, stepper lenses are designed to produce sharp images at only one or two closely spaced wavelengths. Therefore, the most accurate alignment systems utilize monochromatic light at the exposure wavelength to view the alignment marks on the wafer. Absorption by the photoresist and/or variation in reflectivity due to standing wave effects of the monochromatic light in the resist layer can severely reduce the amount of light reflected from the alignment marks on the wafer, thereby degrading alignment accuracy. The standing wave effects also result in variable exposure of the photoresist, resulting in pattern degradation. To eliminate such standing waves, some photolithography processes utilize below the photoresist a layer which absorbs strongly at the exposure wavelength. In such processes, alignment marks on the wafer are particularly difficult to detect.

There are two general types of alignment processes: in the first, the wafer and the mask are individually aligned to a third object and in the second, the wafer and mask are aligned directly to one another. The GCA 4800 wafer stepper uses a global alignment system in which the mask is manually aligned to the exposure optics by aligning marks on the mask to marks on a mask support platten which itself is aligned to the exposure optics. The wafer is manually aligned to an off-axis alignment microscope (i.e. a microscope which is displaced laterally from the exposure optics) by aligning each of a pair of marks on the wafer to a reference mark in each of the two objectives of the alignment microscope. One of the wafer marks is used for x-y alignment and the other wafer mark is then used for rotational alignment. Following such alignment, the wafer stage is moved a fixed distance controlled by an interferometer to align the exposure field of the wafer with the axis of the exposure optics. The use of separate optics for alignment from that used for exposure, enables each to be optimized for its role, but makes accurate alignment subject to positional stability of the exposure optics, alignment microscope and mask support platten as well as the thermal expansion stability of the interconnecting parts between them.

The GCA sitealigner is an automated field-by-field version of the model 4800 wafer stepper. This stepper utilizes circular Fresnel zone plates as wafer alignment marks. In place of the off-axis alignment microscope is a laser source and a quadrant detector. The zone plate acts as a lens to focus the laser light through associated lenses to produce a bright spot detected by the quadrant detector. The wafer stage is automatically moved in response to signals from the quadrant detector to center the focussed laser light onto the quadrant detector.

In the Censor SRA-100 stepper, four alignment marks on the wafer are illuminated on-axis with light of wavelength to which the photoresist is not sensitive. Because the exposure optics is designed for another wavelength, focal length compensation mirrors are used to adjust the optical path to focus the images of the wafer alignment marks through four windows in the mask to a detector. Fully automatic alignment of the four alignment marks with the four windows occurs at each exposure field.

In a stepper developed by Phillips Research Laboratories, the mask contains a linear grating having lines parallel to the x-axis. A laser beam is directed onto this grating and a pair of holes in an opaque barrier act as a spatial filter to pass only the two first order diffraction beams reflected from this grating. These two orders are imaged onto the mask and interfere with each other to produce a sinusoidally varying intensity on the mask. A birefringent plate splits each of these two orders into two orthogonally polarized beams which are slightly laterally displaced from one another so that two sinusoidal patterns of orthogonally polarized light are produced at the mask. At the point on the mask where these sinusoidal patterns are produced, the mask contains a set of opaque parallel lines having the same spacing as the wavelength of these sinusoidal patterns. Alignment exists when the opaque parallel lines on the mask block an equal amount of each of the two sinusoidal patterns. The light which passes through this pattern of parallel lines on the mask also passes through a polarizer having a direction of polarization that rotates at a constant frequency to alternately pass one polarized sinusoidal pattern and then the other. This light passes on into a detector which produces a signal used to vary the relative position between the wafer and mask to control x-axis alignment. A similar system having grating lines along the y-axis is also present in this system to control y-axis alignment.

In a Cameca alignment system illustrated in FIG. 1, the mask contains a one-dimensional amplitude diffraction grating 11 having grating lines parallel to the y-axis and the wafer contains a two dimensional amplitude or phase grating 12 having rows and columns parallel to the x-axis and y-axis respectively. A laser beam of light is directed through the mask grating and focussed by a projection lens 13 to form on wafer grating 12 an image of the mask grating. If the bright lines of the image of the mask grating lie between the columns of the wafer grating, then the image acts as a one dimensional grating and diffracts light into various diffraction orders in the x-z plane. If the mask grating image lines overlay the wafer marks, then light is diffracted in both the x and y directions. In that system, a first order diffracted beam in the y-z plane is monitored to define alignment in the x-direction. A similar pair of gratings is also used to monitor alignment in the y-direction.

In an alignment system presented by D. C. Flanders et. al. in the article "A new interferometric alignment technique", Applied Physics Letters, Vol. 31, No. 7, Oct. 1, 1977, page 426, the mask and wafer each contain one of a pair of parallel one-dimensional gratings having equal line spacings. A perpendicularly incident laser beam is diffracted into various diffraction orders by the mask grating and each of these diffraction orders that impinge on the wafer grating are further diffracted to produce the output diffraction orders. When the mask grating is aligned directly over the wafer grating, each plus order output diffraction beam is equal in intensity to its corresponding minus order output diffraction beam. In that system, alignment in the x-direction is defined to exist when the +1 and −1 output diffraction orders are equal. A similar pair of gratings are used to detect y-direction alignment. A problem with this system is that blazing of the lines on the mask or the wafer (e.g. by wafer processing steps after production of the wafer grating) can result in misalignment of this system.

SUMMARY OF THE INVENTION

In accordance with the illustrated preferred embodiment, an alignment system is presented which utilizes diffraction gratings on the objects to be aligned to one another. In the particular embodiment presented, one object is a wafer and the other object is a mask which is to be aligned to the wafer. The wafer and mask each contain a diffraction grating utilized to effect this alignment. However, the alignment system is also suitable for use in precision alignment of other pairs of objects.

It is advantageous that an alignment system directly align a mask to a wafer so that there is no addition of alignment errors as occurs when the mask and wafer are separately aligned to a third object such as the exposure optics. The alignment should occur on axis so that alignment can be maintained during exposure and the wavelength used should be at or near the exposure wavelength of the exposure system so that alignment error due to chromatic aberration is minimized.

It is also advantageous to automate alignment so that it can occur quickly and accurately to improve throughput. The alignment system should eliminate the use of edge detection or pattern recognition such as is required for manual alignment because of the inherent variability that this introduces, especially at the low intensity levels that can result when standing wave interference reduces the amount of light reflected from alignment marks on the wafer. To be useful in state of the art photolithography, the alignment system should also have an alignment accuracy (3 sigma statistics) of better than 0.15 microns. The system should also be compatible with multilayer resist processes including those in which a layer below the resist is highly absorbing at the exposure wavelength.

In the disclosed alignment system, the mask contains a diffraction grating which is to be aligned to a diffraction grating on the wafer. Monochromatic parallel light is diffracted by the diffraction grating on the wafer and the diffracted light is focussed by optical elements onto the wafer grating. The wafer grating produces additional diffraction of this light to produce various diffraction orders of output light which is monitored to detect alignment. In this system, alignment occurs when the zeroth diffraction order of the output light is at an extremum.

The fundamental theory behind this system can be understood by reference to FIGS. 2A and 2B. Those two figures illustrate the theory for the case of two transmission phase gratings 21 and 22 that are nearly in contact. The depth d of each of these gratings is selected to control the phase difference between light which is transmitted through a peak 23 in the grating and the light transmitted through a trough 24 in the grating. When the peaks of grating 21 are aligned over the peaks of grating 22 as in FIG. 2A, the phase shifts introduced by each of the gratings add. The strongest amount of diffraction results when the depth d is selected so that each grating produces a relative phase shift of one-half pi. When gratings 21 and 22 are aligned so that the peaks of grating 21 are over the troughs of grating 22, light passing through a peak of grating 21 also passes through a trough of grating 22. When the phase shift produced by grating 21 equals that produced by grating 22, then for the alignment shown in FIG. 2B, no relative phase shift results for light passing through a peak of grating 22 as compared to light passing through a trough of grating 22. This results in all of the light passing straight through the gratings (i.e. into the zeroth diffraction order of the output light).

This approach can be utilized to align a contact mask with a wafer. However, when the mask is separated a non-negligible distance from the wafer as in projection photolithography, light diffracted by grating 21 has time to spread out before being diffracted by grating 22. To compensate for this, the disclosed alignment system includes optical elements that focus the light diffracted by the mask grating onto the wafer grating. In effect, the image of the mask grating functions like the contact mask grating 21 of FIGS. 2A and 2B. Since the magnification m of the optical elements need not be unity, the period of the wafer grating is m times the period of the mask grating. The functional variation of the intensity and phase of the light reflected from the wafer grating is the product of the transmission function (appropriately scaled to take into account magnification of the optics) of the mask grating times the reflection function of the wafer grating. The optical elements image this reflected light back onto the mask grating where the mask grating further modulates the amplitude and phase of this light to produce the output beams of diffracted light. In the disclosed preferred embodiment utilized in a photolithographic process, the optical elements of the exposure system are utilized to image the mask grating onto the wafer grating but the system could also be adapted to image the wafer grating onto the mask grating. Each of the diffraction orders from the mask grating which pass through the optical elements are further diffracted by the wafer grating to produce various diffraction orders of output light. Alignment is defined to occur when the zero order of the output light is at an extremum as a function of the relative positions of the mask and wafer gratings.

Because the optical elements have finite apertures, some of the diffraction orders from both gratings do not pass through the apertures. As indicated in the text by J. W. Goodman entitled "Introduction to Fourier Optics" published in 1968 by McGraw-Hill Inc., the various diffraction orders each correspond to a term in the Fourier decomposition of the transmission or reflection function of a diffraction grating. The finite aperture has the effect of filtering out the higher order frequencies of this Fourier decomposition so that these higher frequency components are eliminated from the image of the mask grating on the wafer. This has the effect of rounding the corners of this image. The product of this imaged grating times the reflection function of the wafer grating is the effective diffraction grating which diffracts light back to the mask. The aperture again filters out the higher order frequencies of this effective grating in producing its image on the mask grating. That image is multiplied by the mask grating transmission function in producing the effective grating which generates the output diffraction beams.

In the Description of the Preferred Embodiment, these finite aperture effects are accounted for by use of Fourier transforms in calculating the various diffraction patterns. However, by neglecting the finite aperture effects, the qualitative behavior of the alignment system can be more easily developed. In this approximation, for incident light perpendicular to the mask grating, the effective output grating producing the output beams has an effective output reflection function that is the product of the reflection function $R(x/m)$ of the wafer times the square of the transmission function $T(x)$ of the mask grating. Note that the reflection function has been scaled by m to account for the magnification effects of the optics. Alternatively, by working in terms of the image of the mask grating instead of the mask grating itself, the results allow for the effect of magnification by the optical elements between the two gratings. The zeroth order output beam has an amplitude and phase proportional to the zero order Fourier component of this function—namely, the average over one period of the output reflection function. Each of the wafer and mask gratings can be either a transmission grating or a reflection grating. However, in a photolithographic process, it is convenient to utilize the exposure optics to produce the grating images. In a particularly convenient embodiment, the mask grating is a transmission grating and the wafer grating is a reflection grating. In order to make the system insensitive to interference effects caused by the resist layer, a phase grating is used in the mask. That such a choice enables the elimination of the resist interference can be seen as follows. The top surface of the resist layer reflects some of the incident light producing a component of the output beams that interferes with the component arising from diffraction from the wafer grating. In many processes of interest, the top surface of the resist layer is planar so that its reflection function is just a complex constant. The effective output reflection function is therefore proportional to the square of the mask transmission function which is the same as the transmission function of a square wave phase grating having twice the peak-to-peak phase difference as the mask grating. Since the zero order Fourier component of a phase grating is zero for equal width peaks and troughs and peak-to-peak phase shift of $\pi$, the resist interference is eliminated for a wafer grating having peak-to-peak phase shift of $\pi/2$. When the finite aperture effects are taken into account, this peak-to-peak value is adjusted somewhat.

In order to simplify generation of the mask grating, it is advantageous to utilize a holographic grating as the mask grating since such a grating can be produced without additional steps in the generation of the mask. To achieve alignment in both the x- and y-directions, a pair of 1-dimensional mask and wafer gratings can be used for x-alignment and a second pair of 1-dimensional mask and wafer gratings can be used for y-alignment. Alternatively, a 2-dimensional grating can be used in each of the mask and wafer to achieve alignment in both the x- and y-directions. This latter embodiment has the advantage of eliminating the additional beam splitters and turning mirrors which are required if a separate beam of monocromatic light is required for each pair of gratings when 1-dimensional gratings are used.

Angular orientation about a z-axis perpendicular to the wafer and mask is achieved by using a pair of grating alignment marks on both the wafer and the mask, preferably at opposite extreme limits of the exposure field. The first of these marks is aligned in the x and y directions and then the wafer is rotated about this first mark until the second grating is maximally aligned. In addition to this x-, y- and theta-alignment, the focus of the exposure optics can be adjusted by extremizing the amount of power in the zeroth diffraction order as a function of the spacing between the mask and the wafer. This alignment technique can be used in both global alignment systems and in step-and-repeat systems. When used in a step-and-repeat system, the mask gratings are located in the scribe lines between adjacent circuit patterns. In such systems, x-, y- and theta-alignment as well as focussing can be repeated at each site on the mask.

DESCRIPTION OF THE FIGURES

FIG. 4A is a plot of the amplitude and phase of the transmission function for an amplitude grating.

FIG. 4B is a plot of the amplitude and phase of the transmission function for a phase grating.

FIG. 5 illustrates how defocussing of the exposure optics results in interference between various diffraction orders.

FIG. 6 illustrates the resist and wafer grating reflections that can interfere and result in decreased alignment signal.

DESCRIPTION OF THE PREFERRED EMBODIMENT

Figure 1:
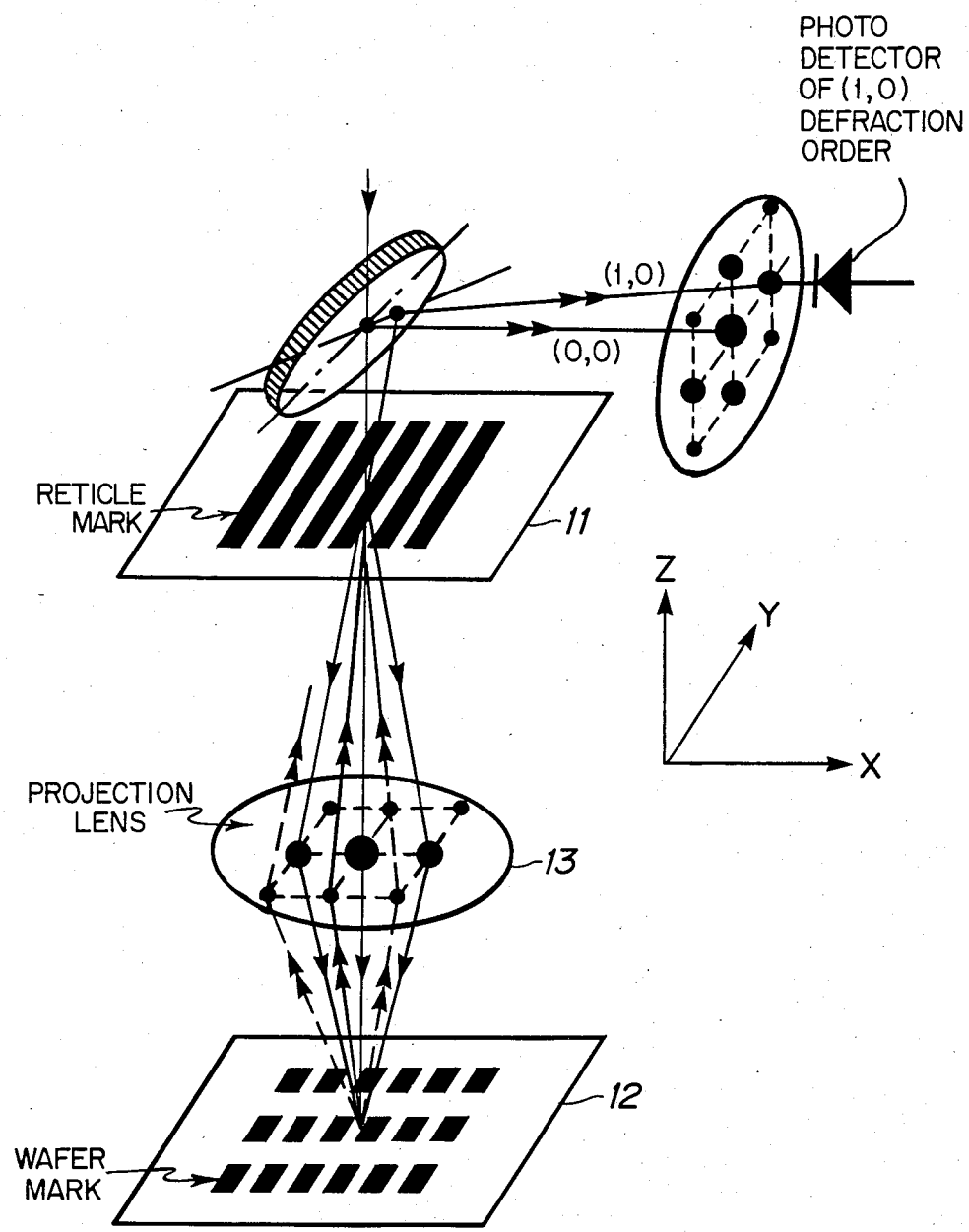
FIG. 1 illustrates a prior art alignment system utilizing a 1-dimensional mask grating and a 2-dimensional wafer grating.

In this section, the first digit of a reference numeral equals the number of the first figure in which the element associated with that reference numeral is presented. The grating alignment concept illustrated in FIGS. 2A and 2B can be adapted to a projection alignment system as shown in FIG. 3. In this system, illustrated in FIG. 3, mask 31 and wafer 33 contain a grating 32 and a grating 34, respectively. Instead of gratings 32 and 34 being in contact or near contact as in the case of a contact mask, it is the image of grating 32 that is in contact with grating 34. A laser beam 35 incident on mask grating 34 is diffracted into several beams 36, some of which pass through an entrance pupil 37 in an opaque barrier 38 and are re-imaged by a projection lens 39 onto wafer grating 34. A laser is utilized primarily because it is a source of intense light, but it is also advantageous to use a laser because it produces collimated monochromatic light. Collimated light is advantageous because it enables the use of planar gratings having parallel lines instead of holographic gratings as is required for converging or diverging light. The use of monochromatic light avoids chromatic aberration in the resulting grating images, but a polychromatic light source could also be utilized in this alignment system. A HeCd laser is utilized because it produces light at 441.6 nanometers, which is near the wavelength for which the optical elements of the photolithography equipment are optimized. In the discussions of the gratings which follow, a coordinate system is used in which the z-axis is perpendicular to the planes of the mask and wafer and the grating lines of each of the gratings are parallel to the y-axis.

Wafer grating 34 functions in reflection mode to further diffract these beams back toward lens 39. Those diffracted beams which pass back through lens 39 and entrance pupil 38 are further diffracted by mask grating 32 to produce a set of output diffraction orders 310. The zero order ouput beam power is modulated by dithering the x- and y-positions of the mask relative to the wafer. The zero order output beam is detected and used to produce an alignment error signal utilized to adjust alignment. The effects of x-, y-, and theta misalignment as well as defocussing of the laser beam are presented in the next sections.

Fourier Optics. As is shown in the text by Joseph W. Goodman entitled Introduction to Fourier Optics, published in 1968 by McGraw-Hill Book Co., the far field diffraction pattern (i.e. many wavelengths from a diffraction grating) from a planar transmission mode diffraction grating is proportional to the Fourier transform of its transmission function. The transmission function $T(x)$ is a complex phasor, $t(x)*\exp(ip(x))$ where t is the amplitude variation introduced by the grating and p is the phase shift introduced by the grating at point x of the grating. Because of the periodic nature of a grating, the Fourier transform of $T(x)$ is discrete so that $$T(x) = \sum_{n=-\infty}^{n=\infty} t_n * \exp(i2\pi nx/L) \tag{1}$$

where $t_n$ is defined to be $$t_n = (1/L) \int_{-L/2}^{L/2} T(x)*\exp(i2\pi nx/L)\, dx \tag{2}$$

where L is the grating period. For a square wave amplitude grating of period L having opaque lines separated by transparent spaces of width q and having a transparent space centered at x=0, the amplitude of the transmission function is shown in FIG. 4A and its $t_n$ have the values:

$t_0 = q/L$ and $t_n = (1/\pi n) \sin(\pi nq/L)$ for all other n. (3)

For a square wave phase grating having equal width peaks and troughs producing a peak-to-peak phase shift S as shown in FIG. 4B, the $t_n$ have the values:

$t_0 = \cos(S/2)$ $t_n = (-i^n * 2/n)\sin(S/2)$ for n odd and $t_n = 0$ for n even and non-zero. (4)

The amplitude and phase of the nth diffraction order is equal to the intensity of the light incident on the grating times the amplitude and phase of the nth Fourier series coefficient $t_n$ of the grating transmission function. For monochromatic light of wavelength W incident on the grating at an angle $a_i$ from the normal to the grating, the direction of the nth order diffraction beam makes an angle $a_n$ with the normal to the grating, where $$\sin(a_n) - \sin(a_i) = nW/L. \tag{5}$$

Equations (1)-(4) enable the phase and amplitudes of the output diffraction beams to be calculated. Denote the Fourier coefficients for the mask grating and the wafer grating by $M_n$ and $W_n$, respectively. Also denote the center-to-center spacing of lines in the mask gratings by L. The period of the wafer grating is mL where m is the magnification of lens 39 in imaging the mask grating on to the wafer. For a unit amplitude laser beam 35 incident on mask grating 32, the nth order diffraction beam from the mask grating has an amplitude and phase represented by a phasor equal to $M_n$. Each of these diffraction beams passing through aperture 37 is collected and imaged onto wafer grating 34 which further diffracts the light in each of these beams.

As is indicated in the article by D. C. Flanders et al cited in the Background of the Invention, if the mth order diffraction beam from the wafer grating resulting from diffraction of the nth order diffraction beam from the mask grating is denoted by (m,n), then each of the beams (m,n) having the same value of m−n (denoted as k) have the same direction. The group of beams having the same value of k is referred to as the kth group. The light in such a group is the sum of the contributions of each of the individual diffraction orders in that group. Thus, for an aperture 37 which only allows diffraction orders in the range from M to N to pass through barrier 38, the phasor $G_k$ corresponding to the light in the kth group is $$G_k = \sum_{r=M}^{N} W_{k-r} * M_r \qquad (6)$$

Each of these groups which pass through lens 39 and aperture 37 is imaged onto the mask grating which produces additional diffraction resulting in a set of output diffraction beams. The phasor corresponding to the kth output beam $OB_k$ is $$OB_k = \sum_{r=M}^{N} M_{k-r} * G_r \qquad (7)$$

$$= \sum_{r=M}^{N} \sum_{s=M}^{N} M_{k-r} * W_{r-s} * M_s \qquad (8)$$

Typically, aperture 37 will be centered on the beams so that $M = -N$—such will be assumed in the following discussion.

Translation Induced Phase Shift. If the mask grating is translated in the x-direction (i.e. perpendicular to its grating lines) by a distance d, then the kth Fourier component $M_k(d)$ for the translated grating is $M_k*\exp(i2\pi nd/L)$. The resulting phasors $OB_k(d)$ corresponding to the output beams when the mask grating has been translated a distance d is:

$$OB_k(d) = \sum_{r=-N}^{N} \sum_{s=-N}^{N} M_{k-r}*W_{r-s}*M_s*\exp(i(k-r+s)2\,d/L) \qquad (9)$$

Figure 2A:
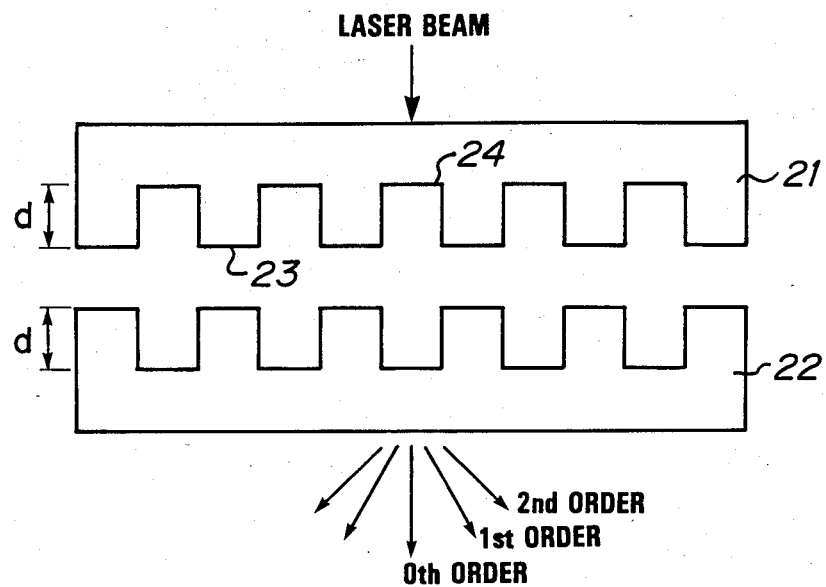
FIGS. 2A and 2B illustrate the effect of alignment between mask and wafer gratings on the power in the zeroth diffraction order of the output light.
Figure 2B:
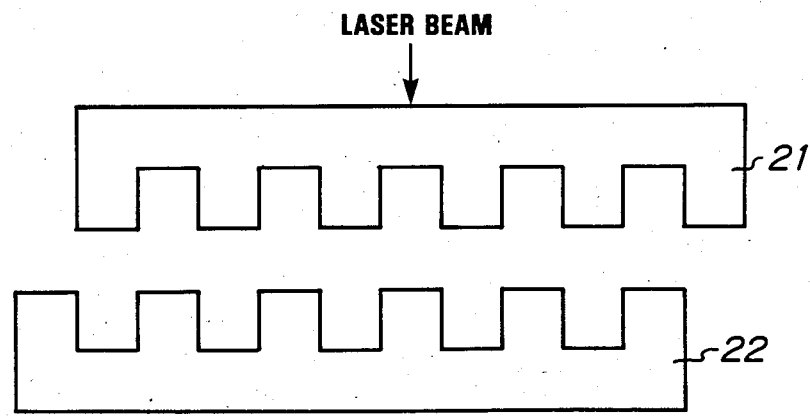
Figure 3:
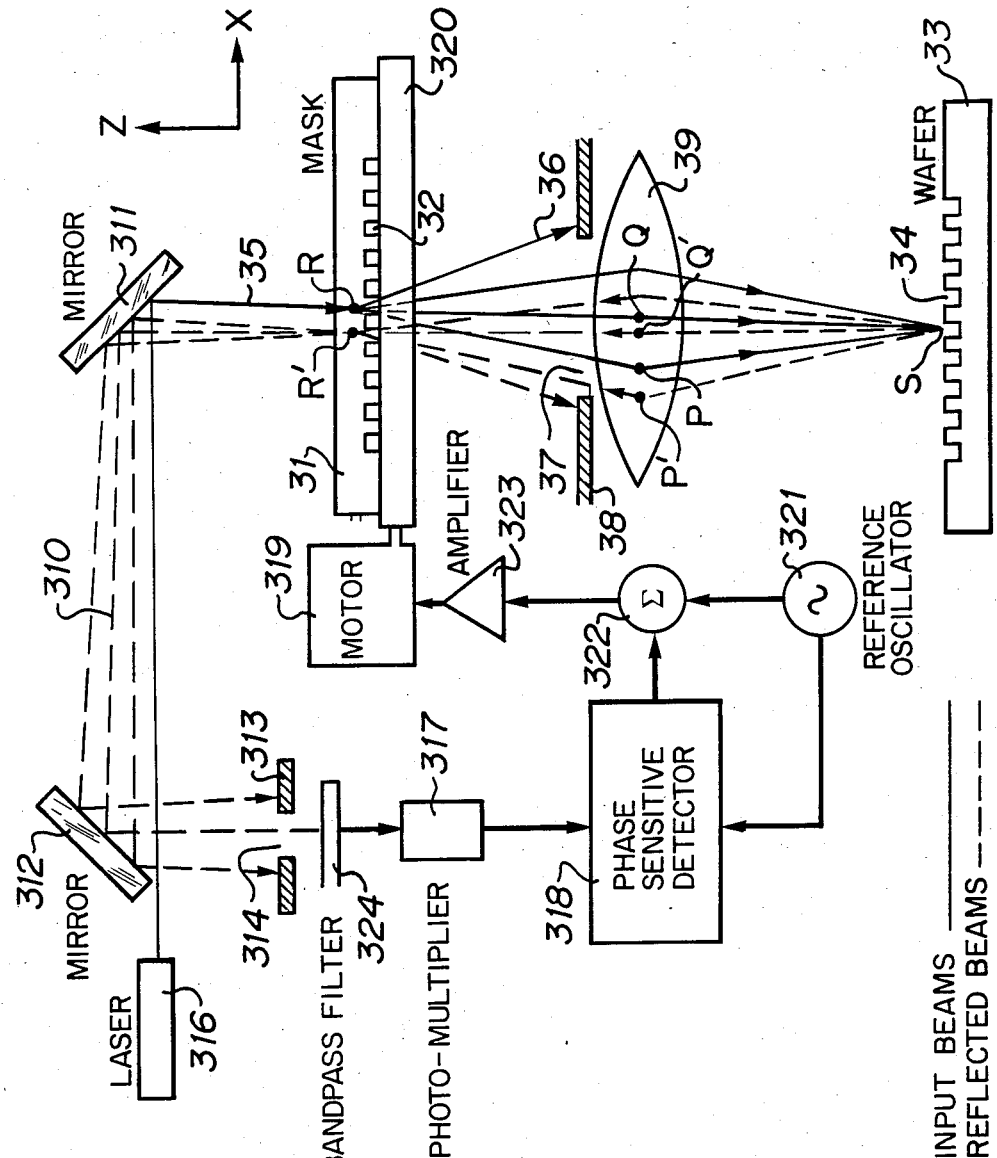
FIG. 3 is a block diagram of the preferred embodiment of the alignment system utilizing phase sensitive detection to automate alignment.

The discussion of the example in FIGS. 2A and 2B suggests that the amplitude of the zero order output beam is at an extremum when the peaks of the mask grating are aligned directly over either the peaks or the troughs of the wafer grating. That this is true for any choice (i.e. amplitude, phase or combination amplitude and phase grating) of mask and wafer grating, each of which has a symmetric arrangement of peaks and troughs, can be shown by use of equations (2) and (9). For any symmetric mask grating, if the plane $x=0$ is centered in the middle of a peak or the middle of a trough, the transmission function is an even function of x so that the sine wave components of the Fourier expansion must be zero. Equivalently, $$M_r = M_{-r} \qquad (10)$$

for such a symmetric grating and choice of coordinate system. An equivalent result also is true for the reflection function of the wafer grating. An extremum in the amplitude of the zeroth order output beam occurs if and only if, for small displacements d in the x direction of the mask relative to the wafer, this amplitude is an even function of d. By renaming the dummy variables r and s to $-r$ and $-s$, respectively, and using equation (10), it is easily shown that $OB_0(d) = OB_0(-d)$. Since this relied only on the symmetry of each grating about the y-axis, this shows that an extremum occurs whenever the peaks of the image of the mask grating are centered on either the peaks or on the troughs of the wafer grating. It should be noted that this is true for any types of symmetric mask and wafer gratings. It should also be noted that this result holds even if there is non-unit magnification m of the optics. In such a case, the period of the wafer grating is mL.

Defocus Induced Phase Shift. Varying the displacement in the z-direction between the mask and wafer also introduces a phase shift in the grating orders. If the wafer is moved a distance D above the focal plane, then, as illustrated in FIG. 5, the nth order diffraction beam incident on the wafer is shifted in phase by $2\pi D * \cos(b_n)/W$ where $b_n$ is the angle of incidence of the nth order beam on the wafer and W is the wavelength of the monochromatic light utilized in wafer alignment. The beams incident on the mask grating likewise have an analogous phase shift proportional to D. The angle of incidence of the nth beam onto the mask is denoted as $a_n$ and is determined by equation (5) where L is the period of the mask grating. The angles $b_n$ are determined by an equation equivalent to equation (5) using the period mL of the wafer grating, where m is the magnification of lens 39.

The phase shift of the zeroth order beam can be treated as an overall phase shift so that only the relative phase shifts of the beams relative to the zeroth beam affects the intensity distribution. For the nth order beam incident on the wafer, this relative phase shift is $2\pi D(\cos b_n - 1)/W$ which for the paraxial rays utilized in a typical optical system is approximately $(b_n)^2 * \pi D/W*W$. The relative phase shift in other than the first order beams can be neglected in a calculation of the intensity of the zeroth order output beam.

The distance D will also produce a relative phase shift between the diffraction orders in the light reflected from wafer grating 34 back to mask grating 32. The amount of this effect can be seen by reference to points P,Q,R and S in FIG. 3. The line RQS is the zeroth diffraction order from mask grating 32 and line RPS is the first order. The angle $b_1$ in FIG. 5 corresponds to angle PSQ in FIG. 3. The corresponding angle for the relative phase shifts in the reflected light is angle P'R'Q' which is essentially equal to angle PRQ (denoted as $b_1'$). That $b_1' = b_1 * m$ can be seen as follows. The magnification m equals the image distance QS divided by the object distance QR so that in the small angle approximation in which tan b is approximated by b:

$$b_1' = PQ/QR = (PQ/QS)(QS/QR) = b_1 * m \qquad (11)$$

For typical reducing systems, m is on the order of 0.1 so that due to $b_1'$ can be ignored compared to the effects due to $b_1$. Thus, we can ignore the relative phase shifts in the reflected light caused by the displacement D of wafer 34 from the focal plane. Therefore, the net effect of varying the spacing between the wafer and mask by D is to add in the intensity of the zeroth order output beam a term which is proportional to $-\cos(2(b_1)^2 D)$. This means that at the proper displacement between mask and wafer for focus, the zeroth order output beam is extremized with respect to this displacement and therefore this can be used to automatically focus the light.

Elimination of Resist Interference. As illustrated in FIG. 6, the top surface of the resist layer reflects some of the incident light, thereby producing a component in the output beam which interferes with the component of light reflected from the wafer grating. To account for the presence of a resist layer on top of the grating, the above derivation of the intensity of the zeroth order output beam must be modified to include the effect of light reflected from the top surface of the resist layer. In a particular process of interest, a planarizing layer is deposited on the wafer before the resist layer is applied. The purpose of the planarizing layer is to make the resist layer planar to eliminate topographic variation of the distance of the resist layer from the mask which can produce local defocussing of the mask image on the resist. In such a process, the top surface of the resist is planar and therefore reflects light without introducing additional diffraction. However, the reflection coefficient at that interface introduces an overall amplitude and phase factor R. In addition, because the top resist surface is at a different z-position than the wafer grating, there will be a phase shifts $c_n$ of the diffraction orders as discussed above in the section on defocussing.

The effect of this reflected light is to add to the zeroth output beam $OB_0$ indicated in equation (8) the term:

$$\sum_{r=-N}^{N} (M_{-r}*R*(M_r*e^{ic_r}) \tag{12}$$

By use of equation (10), this equation can be rewritten as $$R* \sum_{r=-N}^{N} (M_r)^{2*}e^{ic_r} \tag{13}$$

The resist interference is eliminated if this additional contribution to the zeroth order output beam is zero. In general the phase shifts due to defocus are small so that in first approximation they can be ignored. In that approximation, since equation (3) shows that $M_r$ is real for all r for the case of a square wave amplitude grating, the resist reflection contribution represented in equation (12) cannot be zero. However, equation (4) shows that equation (12) can be made zero for the case of a square wave phase grating.

If aperture 37 allowed all of the diffraction orders through, then, as discussed in the Summary of the Invention, the resist contribution would be zero for a phase grating having peak-to-peak phase difference of $\pi/2$. For the situation in which only the first order diffraction beams and the zeroth order diffraction pass through aperture 37, the peak-to-peak phase shift must be 1.07 /2 to eliminate the resist contribution. In general, in the approximation in which all of the diffraction beams pass through aperture 37, there will be no resist related interference with a phase grating on the wafer if the zeroth order Fourier component of the square of the transmission function of the wafer grating is zero.

Figure 7A:
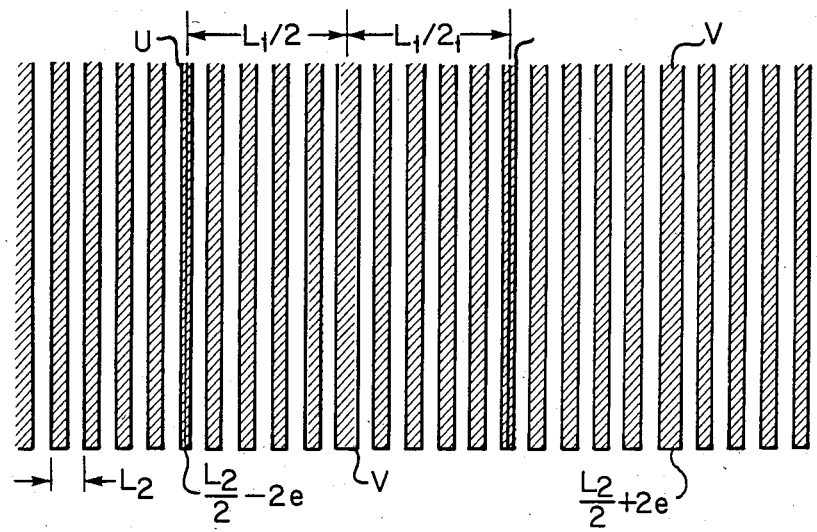
FIGS. 7A and 7B illustrate how a holographic grating produces a pattern equivalent to a phase grating.
Figure 7B:
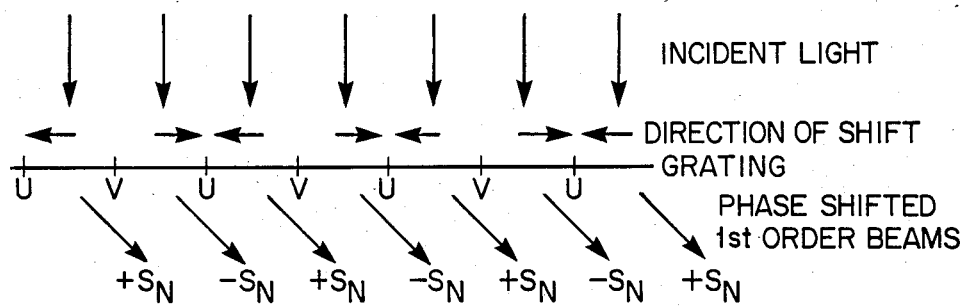

Holographic phase gratings To simplify generation of the mask, a holographic phase grating is utilized as the mask grating. As illustrated in FIG. 7A, a holographic grating of period $L_1$ is produced by dividing an amplitude grating of period $L_2 << L_1$ into sections of length $L_1/2$ and shifting adjacent sections in opposite x-directions by a distance e less than $L_2/2$. The boundary between two adjacent sections moved toward one another is denoted by U and the boundary between two adjacent sections moved apart is denoted by V. Each section acts as an individual grating and, as shown above, the translation of a section introduces a phase shift S into each diffraction order from each section proportional to the distance shifted times the numerical value or the diffraction order. FIG. 6B shows that the alternating phase shift pattern is the same as that created by a square wave phase grating. As a given one of these diffraction orders propagates to the far field region, the pattern becomes essentially equal to that for a phase grating. If aperture 37 in FIG. 3 eliminates all but one of these orders, then the holographic grating is equivalent to a phase grating. The choice $L_1=8*L_2$ results in sufficient angular spacing of the various orders that aperture 37 can be selected to pass only the +1 or −1 order. Because the most power is directed in the +1 and −1 diffraction orders, one of these two orders is selected as the one which passes through the aperture. For convenience, the monochromatic light is chosen to be incident on the wafer at a non-zero incident angle $a_i$ such that one of these first diffraction orders from one of these sections is emitted in the desired direction of the reflected beams as shown in FIG. 3. The angle $a_i$ required to achieve this is determined by equation (4).

Figure 8A:
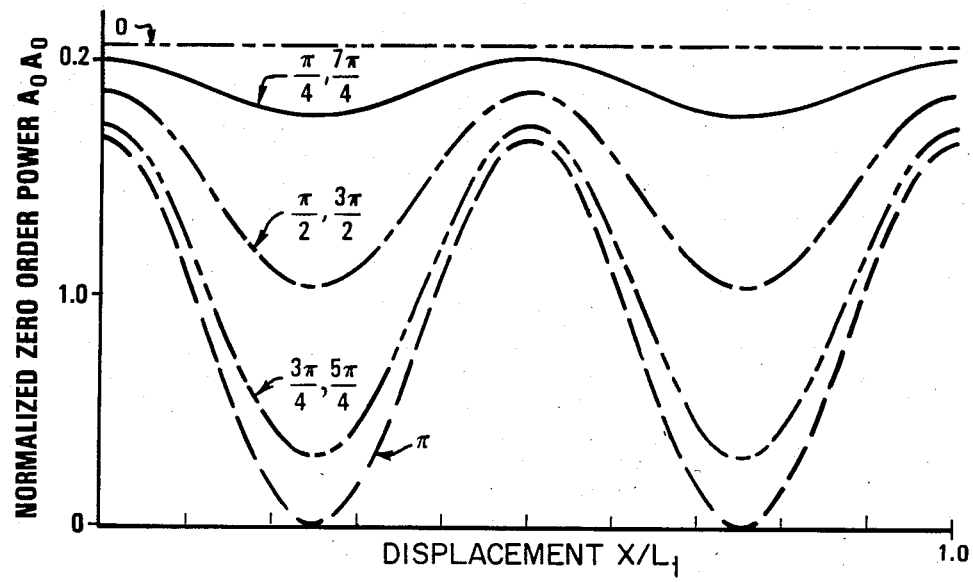
FIGS. 8A and 8B present empirical results for the power in the zeroth order output beam for various mask and wafer gratings.
Figure 8B:
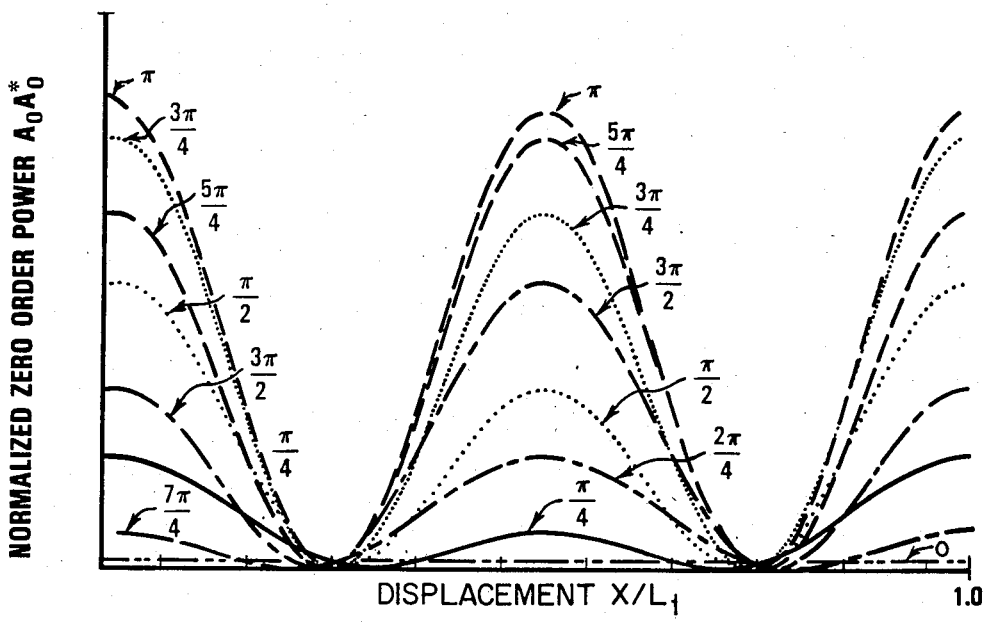

FIG. 8A shows calculated results for the power in the zeroth order output beam for the case of an amplitude grating on the mask and a phase grating of various peak-to-peak phase shifts on the wafer. FIG. 8B shows similar results for a phase grating on the mask and a phase grating of various peak-to-peak phase shifts on the wafer. It should be noted that both show extrema whenever a peak or a trough of the image of the mask grating is aligned over a peak of the wafer grating. It should also be noted in FIG. 8B, that the two peaks are not symmetric and that there is a non-zero amount of power for the case of zero peak-to-peak phase shift. This non-symmetry can be utilized as an alternate method of compensating for resist interference effects.

Figure 9:
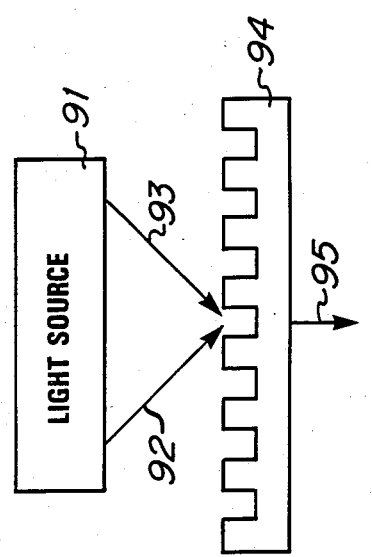
FIG. 9 illustrates a portion of an alignment system suitable for compensating for resist interference effects.

The primary problem created by resist interference effects is that the strength of the zeroth output beam can become extremely small for some values of resist thickness. Such thicknesses will occur from time to time and so, one way or another, this interference effect must be compensated for if the process is to be suitable for all wafers. Since the two peaks in FIG. 8B are not equal, if resist interference makes one of them become substantially zero, then the other peak will be suitable for use in alignment. A system which utilizes this asymmetry is shown in FIG. 9.

As indicated above, the phase shift of the holographic grating is proportional to the numerical value of the diffraction order from each section of the holographic grating. Thus the −1 order has the opposite pattern of phase shifts as that for the +1 order. Therefore, the peak at x=0 for the +1 order corresponds to the peak at $x=L_1/2$ for the −1 order. To utilize the asymmetry, a source 91 of monochromatic light supplies a pair of input beams 92 and 93 at incident angles to a holographic grating 94 such that the −1 diffraction order 95 of beam 92 is perpendicular to grating 94 and the +1 order of beam 93 is parallel to diffraction order 95. Source 91 can be controlled in a number of ways to utilize the asymmetry. In one embodiment, only one of beams 92 and 93 is provided by source 91 at any given time, but if the power of the zeroth order output beam falls another embodiment, beams 92 and 93 are chopped so that the detector receives power from both beams. The beams should not be supplied concurrently or else undesired interference effects will result.

Figures 10A, 10B:
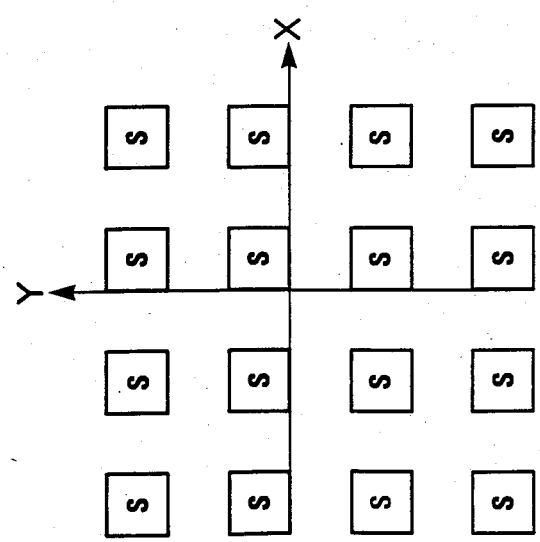
FIGS. 10A and 10B respectively illustrate a suitable 2-dimensional wafer grating and a 2-dimensional mask phase grating.

Two Dimensional Gratings. The 1-dimensional gratings described thus far can measure misalignment in only one direction. To make an x-y alignment correction, two separate orthogonally oriented gratings and two laser beams are required. However, it is possible to measure both x- and y-misalignment with a single laser beam by utilizing 2-dimensional gratings. A suitable wafer grating and a suitable mask phase grating are shown in FIGS. 10A and 10B, respectively. The mask grating has the desired property that, aside from the corrections due to finite aperture effects as discussed above, the resist interference is eliminated. As in the 1-dimensional case, the square of the transmission function of the mask grating must have a zero average over any given cell of the 2-dimensional pattern. Also, as in the 1-dimensional case, the peak-to-peak phase difference can be adjusted to eliminate resist interference effects when finite aperture filtering effects are included. It is generally difficult to accurately etch a phase grating having two different depths of etch as for the phase grating in FIG. 10B. However, such a three phase phase-grating is easily produced as a holographic grating.

To take account of finite aperture effects, the 2-dimensional transmission coefficients $t_{mn}$ and reflection coefficients $r_{mn}$ corresponding to the mth diffraction order in the x-direction and the nth diffraction order in the y-direction must be determined for the mask and wafer gratings, respectively. The 1-dimensional equations above are easily generalized to 2-dimensional sums over all of the diffraction orders that pass through aperture 37. Two-dimensional gratings for which the transmission function $t(x,y)$ and the reflection function $r(x,y)$ are products of a function of x times a function of y (i.e. $t(x,y)=f(x)g(y)$) are particularly simple to analyze. For such gratings, $t_{mn}$ becomes a product $f_m{}^*g_n$ where $f_m$ and $g_n$ are Fourier coefficients in the Fourier expansions of $f(x)$ and $g(y)$, respectively. The grating in FIG. 10B is an example of such a grating.

Phase Sensitivee Detection In FIG. 3 is shown a block diagram of the automated alignment system. The optical paths of the output diffraction beams 310 are bent by a turning mirror 311 to deflect them to a scraper mirror 312 which deflects them to an opaque barrier 313 containing an aperture 314. Laser beam 35 and output beams 310 are slightly displaced laterally so that output beams 310 are deflected by the scraper mirror but laser beam 35 passes from a laser source 316 past the edge of scraper mirror 312. The laser beam is deflected by turning mirror 311 which directs it onto wafer grating 32.

Barrier 313 serves to block all of the output beams other than the zeroth order ouput diffraction beam 315 which passes through aperture 314. Beam 315 passes on through a bandpass filter 324 to a photomultiplier 317. The bandpass filter passes only light near the frequency of the laser light in beam 35 to eliminate background light and light at the frequency used to expose the photoresist on the wafer. This enables continuous alignment to be maintained during each exposure of a site on the wafer without degradation of alignment caused by leakage of exposure light into photomultiplier 317. The laser is attenuated to 3 microwatts to avoid saturating the photomultiplier. The amplification of the photomultiplier tube is regulated by an automatic gain control circuit to maintain a constant amplitude of average output signal. Because of the four decade range of this amplification, the automatic control of the gain makes the circuit insensitive to attenuation by absorbing layers in the wafer.

Figure 11:
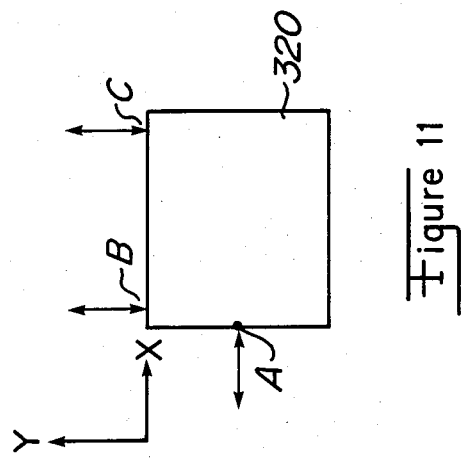
FIG. 11 shows a top view of the reticle stage illustrating its coupling to the translation motor.

In response to the output signal of photomultiplier 317, a phase sensitive detector 318 produces an x-position alignment error signal. A motor 319 (e.g., a piezoelectric motor), connected by flexure pivot bearings to a reticle stage 320 on which mask 31 is mounted, is responsive to the error signal to adjust the x-position of the reticle stage relative to the wafer to achieve alignment between the mask and the wafer. Clearly, only relative movement between the mask and the wafer is important, so that in other embodiments, the motor can be coupled to the wafer to adjust its position instead of the position of the mask. To enable alignment in the x-direction, three piezoelectric motors are connected to the reticle stage as shown in FIG. 11. One motor is attached substantially in the center (point A) of a first side of the reticle stage and is used for x-translations. A pair of motors are each connected to an opposite end (points B and C) of a second side adjacent to the first side. When activated equally, this pair of motors produce y-translations and, when activated unequally, additionally produce rotations about the z-axis.

To sense the direction and magnitude of alignment error, a phase sensitive detection method is used. To implement this method, a periodic signal source such as oscillator 321 supplies a sinusoidal signal to motor 319 to dither the x-position of the mask, thereby producing a periodic component in the photomultiplier output signal. The peak-to-peak amplitude of dithering is approximately one micron. Phase sensitive detector 316 integrates the product of the photomultiplier output signal with the reference oscillator signal for 30 cycles of the reference oscillator to measure the Fourier component of the photomultiplier signal at the frequency of reference oscillator 321. Detector 318 provides to an adder 322 a DC signal proportional to this Fourier component. At exact alignment, the Fourier component of the x-position error signal at the frequency of oscillator 321 is zero. The magnitude of the error signal is proportional to the amount of misalignment, including the sign of misalignment. The x-position of reticle stage 320 is determined by the voltage at the input of the piezoelectric motor controlling x-translation. Amplifier 323 includes an integrator which integrates the error signal so that translation of the reticle stage ceases when the error signal goes to zero.

To enable concurrent adjustment of the x-position of the mask and dithering of the x-position of the mask, the error signal and the sinusoidal oscillator are combined in an adder 322 and then amplified by an amplifier 323 before being supplied to motor 319. The alignment system operates for 200 milliseconds to produce fine alignment of the system and then the reference signal is decoupled from adder 322 and the DC voltage at the input of the piezoelectric motor 319 is stored in a sample and hold circuit. This holds the reticle stage at the aligned position and eliminates the oscillatory motion of the reticle during exposure of the wafer.

The x- and y-alignments can be performed concurrently by dithering the reticle stage in the x-direction at a different frequency than in the y-direction. In one embodiment, these two frequencies are 150 Hz and 170 Hz, respectively. The error signal for x-alignment is then proportional to the 150 Hz component of the photomultiplier signal and the error signal for y-alignment is proportional to the 170 Hz component. It is advantageous to dither the mask rather than the wafer because the mask can be dithered at a higher frequency, enabling a shorter duration for alignment.

Before utilization of this alignment system, each wafer and mask are pre-aligned by conventional techniques such as the off-axis technique of GCA to align the wafer and mask within plus or minus one-quarter period of the wafer grating. The alignment system aligns to the nearest extremum and therefore plus or minus one-quarter period is the capture range of the alignment system. The period of the wafer grating is 8 microns so that the capture range is ±2 microns.

The alignment system can be utilized to produce fine alignment in a global alignment system and can also be used for site by site alignment. In the latter case, alignment gratings are provided in the scribe lines between adjacent dies so that the grating does not interfere with exposure of each die. When the translation of the wafer relative to the reticle stage to bring the next die within the field of the exposure optics is completed, a signal is generated by the stepper to activate exposure of the die. This signal is utilized to activate the fine alignment at that die location and this same signal, delayed by 400 milliseconds (which is sufficient to complete fine alignment) is utilized to activate exposure of this die.

In general, gratings will have to be produced in more than one of the layers deposited and patterned on the wafer. The first grating is produced in the oxide layer. In steps such as implantation steps or steps in which thin layers are deposited, the functionality of the wafer utilized in the previous mask step will not be significantly affected and therefore that grating can also be utilized in a subsequent step. However, when a thick layer is deposited, replication of the mask pattern will produce in the thick layer a grating overlapping that in the previous layer and therefore will disrupt diffraction from both overlapping gratings. When this will occur, another mask grating at another location in the scribe line should be included in the mask so that it results in a fully functional grating in the thick layer after patterning of the thick layer.

I claim:

1. A method of aligning a first object with a second object, said method comprising the steps of:
   (a) diffracting light from a first diffraction grating on the first object to the second object;
   (b) diffracting light from the first diffraction grating off of a second diffraction grating on the second object to produce a zeroth order output beam from the second grating; and
   (c) varying, in a first direction, the relative position between the first object and the second object until the intensity of the zeroth order output beam is at an extremum with respect to such positional variation in order to align these two objects in the first direction.

2. A method as in claim 1 wherein the first and second diffraction gratings are two dimensional gratings, said method further comprising the step of:
   (d) varying, in a second direction non-collinear with the first direction, the relative position between the first object and the second object until the intensity of the zeroth order output beam is at an extremum with respect to such positional variation in order to align these two objects in the second direction.

3. A method as in claim 2 further comprising the step of:
   (e) varying, in a third direction non-coplanar with the first and second directions, the relative position between the first object and the second object until the intensity of the zeroth order output beam is at an extremum with respect to such positional variation in order to align these two objects in the third direction.

4. A method as in claim 1 further comprising the step of;
   (f) focussing the light diffracted from the first diffraction grating onto the second diffraction grating 5. A method as in claim 1 further comprising before step (a) the step of:
   (g) diffracting light from the second diffraction grating to the first object to provide the light diffracted by the first diffraction grating.

6. A method as in claim 5 wherein the light diffracted from the first diffraction grating is diffracted in reflection mode and wherein the second grating is a phase grating selected to produce zero contribution to the intensity of the zeroth order output beam light reflected without diffraction from the first object, whereby any planar layers overlying the first grating will not produce reflections that contribute to the intensity of the zeroth order output beam.

7. A method as in claim 1 wherein at least one of the diffraction gratings is an amplitude grating which functions as a holographic phase grating.

8. A method as in claim 1 further comprising before step (a) the step of:
   (h) pre-aligning the first object to the second object to within a capture range in which alignment by steps (a)–(e) utilizes the extremum in the intensity of the zeroth order output beam corresponding to the desired alignment between the first and second objects.

9. A method as in claim 1 wherein step (c) comprises the steps of;
   (i) dithering in the first direction the relative position between the first and second objects, whereby a small oscillatory component is introduced into the intensity of the zeroth order output beam enabling the slope of the intensity of the zeroth order output beam as a function of motion in the first direction to be determined;
   (j) in response to the oscillatory component in the intensity of the zeroth order output beam, varying the relative position of the first and second sources in the first direction to produce said extremum in this intensity.

10. A method as in claim 9 wherein step (j) comprises the steps of;
    (k) producing a DC error signal proportional to the Fourier component in the intensity of the zeroth order output beam at the frequency at which the relative position of the first and second sources are dithered in the first direction; and
    (l) in response to the error signal, varying this relative position to a point at which this error signal is substantially zero.

11. A method as in claim 5 wherein the first object is a wafer, the second object is a mask, the first diffraction grating has zero amplitude so that it functions as a mirror, the second grating is a phase grating, and the mask and wafer each lie in a plane perpendicular to the first direction, said method further comprising the step of:
    (m) focussing the light diffracted between the mask and wafer with optical elements utilized to focus light used to expose the wafer during photolithographic processing, whereby the alignment in the first direction functions to adjust the separation in the first direction between the mask and wafer to adjust the focus of the light used to expose the wafer.

12. A method of aligning a first object with a second object, said method comprising the steps of:

(n) diffracting light from a first diffraction grating on the first object to the second object;

(o) diffracting light from the first diffraction grating off of a second diffraction grating on the second object to produce from the second grating an output beam containing a single diffraction order;

(p) dithering in a first direction the relative position between the first and second objects, whereby a small oscillatory component is introduced into the intensity of the output beam enabling the slope of the intensity of the output beam as a function of motion in the first direction to be determined; and (q) in response to the oscillatory component in the intensity of the output beam, varying the relative position of the first and second objects in the first direction to produce an extremum in this intensity.

13. A method of aligning a first object with a second object, said method comprising the steps of:

(r) diffracting light from a first diffraction grating on the first object to the second object;

(s) diffracting light from the first diffraction grating off of a second diffraction grating on the second object to produce an output beam from the second grating, at least one of the first and second diffraction gratings being a holographic phase grating;

(t) in response to the output beam, producing a position signal that is indicative of the relative position of the first object relative to the second object; and (u) varying, in a first direction, the relative position between the first object and the second object until the position signal indicates that said relative position is equal to a reference aligned position.

* * * * *

UNITED STATES PATENT AND TRADEMARK OFFICE
CERTIFICATE OF CORRECTION

PATENT NO. : 4,631,416

DATED : December 23, 1986

INVENTOR(S) : William R. Trutna, Jr.

It is certified that error appears in the above-identified patent and that said Letters Patent is hereby corrected as shown below:

Column 1, line 31, Add after "advantageous" -- for the alignment subject to be automated.--

Signed and Sealed this

Nineteenth Day of January, 1988

Attest:

DONALD J. QUIGG

Attesting Officer

Commissioner of Patents and Trademarks